(12) United States Patent
Muroyama

(10) Patent No.: US 6,580,155 B1
(45) Date of Patent: Jun. 17, 2003

(54) SEMICONDUCTOR DEVICE

(75) Inventor: Masakazu Muroyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/504,814

(22) Filed: Feb. 16, 2000

(30) Foreign Application Priority Data

Feb. 18, 1999 (JP) .......................................... 11-040335

(51) Int. Cl.$^7$ .......................... H01L 23/58; H01L 23/48
(52) U.S. Cl. ...................... 257/639; 257/637; 257/643; 257/760
(58) Field of Search ................................ 257/635, 636, 257/637, 639, 640, 642, 643, 646, 649, 758, 759, 760; 438/82, 724, 725, 744, 769

(56) References Cited

U.S. PATENT DOCUMENTS 4,907,064 A * 3/1990 Yamazaki et al. .......... 257/649
5,057,897 A * 10/1991 Nariani et al. .............. 257/637
6,133,619 A * 10/2000 Sahota et al. ............... 257/649
6,268,283 B1 * 7/2001 Huang ........................ 438/638

FOREIGN PATENT DOCUMENTS

JP           61-95515          * 5/1986

* cited by examiner

Primary Examiner—Tom Thomas
Assistant Examiner—Hung Kim Vu
(74) Attorney, Agent, or Firm—Sonnenschein, Nath & Rosenthal

(57) ABSTRACT

The semiconductor device comprising a lower conductive layer (11) and an upper conductive layer (12) which are formed via an interlayer insulator (20) on a substrate (1), wherein the interlayer insulator (20) has a stack structure of an organic resin layer (21) formed on the lower conductive layer (11) and one or more high water-resistant insulating film (22) having a specific Si content formed on the organic resin layer (21). Even when the interlayer insulator realized by an organic resin insulating film of a low dielectric constant is used, characteristic and realizability is prevented from being deteriorated.

3 Claims, 7 Drawing Sheets

SEMICONDUCTOR DEVICE

RELATED APPLICATION DATA

The present application claims priority to Japanese Application No. P11-040335 filed Feb. 18, 1999 which application is incorporated herein by reference to the extent permitted by law.

BACKGROUND OF THE INVENTION

1. Field of the Invention

The present invention relates to a semiconductor device and a method of fabricating the same and, more particularly, a semiconductor device such as a semiconductor integrated circuit device having a structure in which at least two conductive layers such as wiring layers are stacked via an interlayer insulator and a method of fabricating the same.

2. Description of the Related Art

Since the components are becoming finer in association with the miniaturization of a semiconductor device, that is, the size according to what is called a device rule is becoming smaller, the distance between wiring patterns is shortened. For example, when neighboring wiring patterns in a lower wiring layer is narrowed, there is a problem of a parasitic capacity caused by an interlayer insulator interposed between the lower wiring layer and an upper wiring layer formed so as to enter the space between the neighboring wiring patterns. Attention is paid to a problem such as an operation delay caused by the parasitic capacity.

It is therefore becoming more and more necessary to examine an insulating material of a low dielectric constant as the insulating material of the interlayer insulator.

For instance, as shown in a schematic cross section of the main part in FIG. 9, a semiconductor integrated circuit device has a structure such that two or more layers such as a lower conductive layer 11 and an upper conductive layer 12 are stacked via an interlayer insulator 2 on a semiconductor substrate 1.

In the example of the diagram, on an insulating layer 3 made of $SiO_2$ or the like deposited on the substrate 1, the lower conductive layer 11 such as a lower wiring layer in a predetermined pattern made of a metal, a polycrystal semiconductor, or the like is formed. On the lower conductive layer 11, the upper conductive layer 12 such as an upper wiring layer in a predetermined pattern made of a metal, a polycrystal semiconductor, or the like is formed via the interlayer insulator 2.

The upper conductive layer 12 and the lower conductive layer 11 are electrically connected to each other via a buried conductive layer 4 formed by filling a connection hole 2c, what is called a via hole, formed in the interlayer insulator 2 with tungsten (W) or the like on the connecting part between the lower conductive layer 11 and the upper conductive layer 12.

In such a semiconductor device, for example, when the distance (d) between the patterns in the lower conductive layer 11 is shortened with the miniaturization of the device, the parasitic capacity between the patterns becomes a problem. In order to reduce the parasitic capacity, it is required to use a material of a dielectric constant as low as possible as the material of the interlayer insulator 2 interposed between the patterns.

It has been proposed that an SiOF film fabricated by using a material obtained by adding $C_2F_6$ or $NF_3$ as a fluorine element to TEOS (tetraethyl orthosilicate) is used as the insulating film of a low dielectric constant (25th SSDM' 93, p. 161 and 40th United Lecture Conference related to Applied Physics, Preprint, 1a-ZV-9).

In this case, however, it has been reported that the film quality deteriorates as the content of fluorine to be added increases and, accordingly, moisture resistance largely deteriorates.

On the other hand, formation of an SiOF film by using an $SiF_4/O_2$ gas in which fluorine is contained in a raw material gas structure has been being examined for stabilization of the film quality (40th United Lecture Conference related to Applied Physics, Preprint, 31p-ZV-1).

The dielectric constant of the SiOF film obtained by the method is, however, at most about 3.8 due to moisture absorbency.

On the other hand, aiming at the dielectric constant of 3.8 or lower, it has been proposed to use an organic resin material as the material of the interlayer insulator.

For example, a method of fabricating an insulating film made of an organic resin material having a low dielectric constant by using both of a thermal decomposing reaction and a thermal polymerizing reaction of a raw material gas of a dimmer has been proposed. The dielectric constant of an organic resin layer formed by the method is as low as about 2.3 (VLSI/ULSI MULTI LEVEL INTERCONNECTION CONFERENCE, p. 207, 1996).

Another example relates to polyaryl ether as a material used in a rotational application method.

In the case of fabricating a semiconductor device of what is called a multilayer wiring structure in which at least two conductive layers such as wiring layers are stacked via the interlayer insulator as described above, an operation of opening a connection hole in the interlayer insulator is performed in order to connect the upper and lower wiring layers (that is, the upper and lower conductive layers) disposed so as to sandwich the interlayer insulator.

The operation of opening the connection hole is generally carried out by etching using a photoresist layer as an etching mask. In the case of using the organic resin insulating film of a low dielectric constant as the interlayer insulator, the etch selectivity between the organic resin insulating film of a low dielectric constant and the photoresist layer made of a photosensitive resin is low. Consequently, the photoresist layer itself cannot be used as an etching mask.

When the organic resin insulating film of a low dielectric constant is used as the interlayer insulator, an opening such as the connection hole is etched in the insulating film by a method of forming a so-called hard mask layer serving as the etching mask on the organic resin insulating film of a low dielectric constant.

An example will be described by referring to FIGS. 10A to 10C. In FIGS. 10A to 10C, the same components as those in FIG. 9 are designated by the same reference numerals and the description is omitted here.

First, as shown in FIG. 10A, a hard mask layer 5 made of $SiO_2$ or the like is deposited on the interlayer insulator 2 which is the organic resin insulating film of a low dielectric constant formed on the lower conductive layer 11. The hard mask layer 5 is subjected to pattern etching. For this purpose, a photoresist layer 6 is applied on the hard mask layer 5, a predetermined pattern is exposed and developed by photolithography on the photoresist layer 6, and an opening 6W is formed over a part where a connection hole 2c is to be formed in the interlayer insulator 2.

As shown in FIG. 10B, by using the photoresist layer 6 as the etching mask, the hard mask layer 5 exposed through the opening 6W is etched to form an opening 5W below the opening 6W.

After that, as shown in FIG. 10C, the interlayer insulator 2 exposed to the outside through the openings 6W and 5W is etched to thereby open the connection hole 2c as an object.

Although the etch selectivity between the photoresist layer 6 and the interlayer insulator 2 realized by the organic resin insulating film of a low dielectric constant is low, since $SiO_2$ having a high etch selectivity with the organic resin insulating film of a low dielectric constant is deposited on the interlayer insulator 2, the connection hole 2c can be opened in the interlayer insulator 2.

The connection hole 2c formed as mentioned above is filled with tungsten W or the like, thereby forming a buried conductive layer 4 as described in FIG. 9.

In the case of using the organic resin insulating film of a low dielectric constant as the interlayer insulator, however, a problem such that the characteristic deteriorates and the reliability accordingly deteriorates occurs.

Specifically, as described above, the $SiO_2$ film used as a hard mask is deposited by CVD (Chemical Vapor Deposition) for opening the connection hole. In the formation of the $SiO_2$ film, the flow rate of silane to oxygen of a raw material gas is usually set to about 1:2. At this time, $O_2$ radicals occur and carbon on the surface of the organic resin insulating film of a low dielectric constant is removed. It reduces the concentration, the surface is converted, the moisture resistance deteriorates, moisture is easily diffused into the film, and an inconvenience such that the dielectric constant becomes higher due to the diffusion of moisture occurs. Simultaneously, the mechanical strength deteriorates in the organic resin insulating film of a low dielectric constant, that is, the interlayer insulator. Due to the diffusion of moisture, the burying strength of the buried conductive layer in the connection hole is reduced, the contact resistance deteriorates, and peeling occurs.

SUMMARY OF THE INVENTION

The invention intends to solve the problems.

According to the invention, there is provided a semiconductor device comprising a lower conductive layer and an upper conductive layer which are formed via an interlayer insulator on a substrate, wherein the interlayer insulator has a stack structure of an organic resin layer formed on the lower conductive layer and one or more high water-resistant insulating films formed on the organic resin layer.

According to the invention, there is provided a method of fabricating a semiconductor device comprising a lower conductive layer and an upper conductive layer formed via an interlayer insulator on a substrate, wherein a step of forming the interlayer insulator includes a step of forming an organic resin layer on the lower conductive layer and a step of forming one or more high water-resistant insulating films on the organic resin layer.

The lower and upper conductive layers are not limited to only two conductive layers but include conductive layers such as wiring layers which are in relatively upper and lower layer positions via the interlayer insulator.

As described above, in the semiconductor device according to the invention, the interlayer insulator has a stack structure in which the high water-resistive insulating film is stacked on the organic resin layer. An insulating film of a low dielectric constant is used as the organic resin layer, thereby reducing the parasitic capacity. By stacking the high water-resistant insulating film on the organic resin layer, moisture or oxygen is prevented from being diffused into the organic resin layer when another insulating film or the like is formed. For example, thermal decomposition or oxidation reaction of the resin composition in a semiconductor device fabricating process is suppressed.

DETAILED DESCRIPTION OF THE PREFERRED EMBODIMENT

Figure 1:
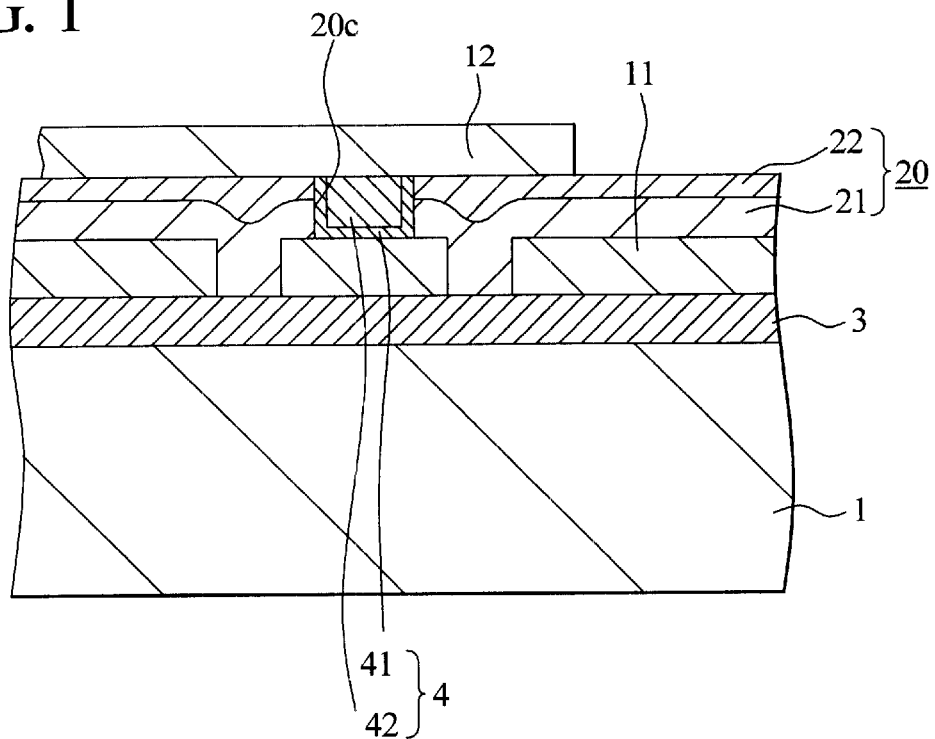
FIG. 1 is a schematic cross section of the main part of an example of a semiconductor device according to the invention.

In a semiconductor device according to the invention, an interlayer insulator has a stack structure of an organic resin layer formed on a lower conductive layer and one or more high water-resistant insulating films formed on the organic resin layer.

The organic resin layer can be made of polyaryl ether which is insulating and has a dielectric constant $\in$ that is equal to or lower than 3 ($\in \leq 3$), for example, $\in=2.8$).

Other than that, polyimide fluoride, poly-para-xylene, polyimide, polyquinoline, polyamide, or the like can be used.

The high water-resistant insulating film is realized by a high water-resistant inorganic insulating film such as a silicon oxide film, a silicon oxynitride film, or a silicon nitride film. The high water-resistant insulating film can have either a single layer structure or a multilayer structure.

Preferably, the high water-resistant insulating film in contact with the organic resin layer is realized by a film having an Si content higher than that of $SiO_2$, which is a silicon oxide film having an Si content of 35 at. (atomic) % or higher or a silicon oxynitride film or silicon nitride film having an Si content of 30 at % or higher. More preferably, it is made of SiN containing no oxygen.

When the high water-resistant insulating film is realized by the silicon oxide film, as described above, the Si content of the film is 35 at % or higher, for example, 35 at % to 75 at %, preferably, 40 at % to 60 at % for the following reason. When the Si content is lower than 40 at %, especially, 35 at %, the water resistance of the silicon oxide film is insufficient. When the Si content exceeds 60 at %, especially, 75 at %, a problem occurs in the property of a polysilicon layer or the film quality, that is, water resisting property.

When the high water-resistant insulating film is realized by the silicon oxynitride film, as described above, the Si content is set to 30 at % or higher, for example, 30 at % to 70 at %, preferably, 35 at % to 55 at %. In this case, since nitrogen (N) is contained, with the Si content lower than that of the silicon oxide film, the water resisting effect can be obtained.

It is desired that the film thickness of the whole high water-resistant insulating film is selected from 10 nm to 500 nm, preferably, 50 nm to 400 nm for the following reason. When the film thickness is less than 10 nm, a problem occurs in the reliability regarding the water resisting property. When the film thickness exceeds 500 nm, the thickness of the whole interlayer insulator increases, the aspect ratio (depth/diameter of hole) of the connection hole for connecting the upper and lower conductive layers becomes higher. Consequently, the reliability with respect to the formation of the accurate connection hole and the filling of the connection hole with the buried conductive layer deteriorates.

As described above, the high water-resistant insulating film can have either the single layer or multilayer structure. As the high water-resistant insulating film formed in contact with the organic resin layer, it is preferable to use the silicon nitride film containing no oxygen or the very dense silicon oxynitride film having a low oxygen content. To be specific, when the high water-resistant insulating film has, for example, the two-layer structure, the silicon nitride film is formed as the lower layer and the silicon oxide film or silicon oxynitride film is deposited as the upper layer, or the silicon oxynitride film is formed as the lower layer and the silicon oxide film is deposited as the upper layer.

FIG. 1 is a schematic cross section of the main part of an embodiment of a semiconductor device according to the invention. The device of the invention is not limited to the example.

In the embodiment, a high water-resistant insulating film serving as an interlayer insulator has a single layer structure.

In the example, the lower conductive layer 11 and the upper conductive layer 12 are stacked via an interlayer insulator 20 on the substrate 1 such as a semiconductor substrate.

In the example of the diagram, on the surface of the insulating layer 3 made of $SiO_2$ or the like deposited on the silicon semiconductor substrate 1, the lower conductive layer 11 such as a lower wiring layer in a predetermined pattern made of a metal or a polycrystal semiconductor is formed. On the lower conductive layer 11, the upper conductive layer 12 such as an upper wiring layer in a predetermined pattern made of a metal or a polycrystal semiconductor is formed via the interlayer insulator 20.

The upper conductive layer 12 and the lower conductive layer 11 are electrically connected to each other through the buried conductive layer 4 in the connection hole 20c or via hole opened in the interlayer insulator 20.

The buried conductive layer 4 has a structure in which a metal underlayer 41 made of Ta, Ti, or the like is formed and a buried metal layer 42 made of tungsten W or the like is deposited on the metal underlayer 41 in the connection hole 20c.

The interlayer insulator 20 has a structure such that a high water-resistant insulating film 22 is deposited on the above-mentioned organic resin layer 21.

The high water-resistant insulating film 22 is realized by a silicon oxide film having a thickness of 100 nm or the like and containing 35 at % or more, for example, 42 at % of Si.

The high water-resistant insulating film 22 is not limited to the silicon oxide film. For example, the silicon oxynitride film or the silicon nitride film can be also used.

Figure 2:
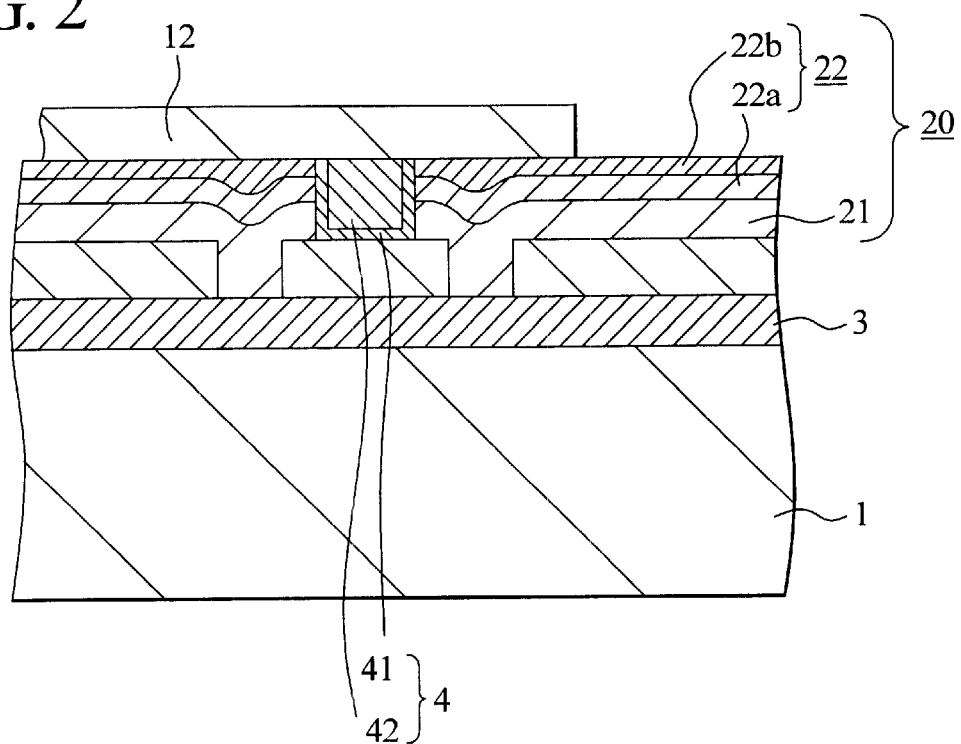
FIG. 2 is a schematic cross section of the main part of another example of the semiconductor device according to the invention.

Another embodiment of the semiconductor device according to the invention will now be described. FIG. 2 is a schematic cross section of the main part of an example of the embodiment. The embodiment is not limited to the example.

In the embodiment, the high water-resistant insulating film in the interlayer insulator has a two-layer structure.

The example is similar to the example shown in FIG. 1 except for the structure of the interlayer insulator 20. In FIG. 2, the components corresponding to those in FIG. 1 are designated by the same reference numerals and the description is omitted here.

In the example, the interlayer insulator 20 has a structure such that the high water-resistant insulating film 22 consisting of first and second high water-resistant insulating films 22a and 22b is stacked on the organic resin layer 21.

The first and second high water-resistant insulating films 22a and 22b can be obtained by a combination of any two elements of a silicon oxide (hereinbelow, referred to as SiO) of a high Si content, a silicon oxynitride (hereinbelow, referred to SiON), and a silicon nitride (hereinbelow, referred to as SiN). As described above, it is preferable to use SiN containing no oxygen or very dense SiON containing a small amount of oxygen as the lower layer. For example, the first high water-resistant insulating film 22a is made of SiN and the second high water-resistant insulating film 22b is made of SiO.

In the devices of the invention shown in FIGS. 1 and 2, although the organic resin layer 21 of a low dielectric constant is used in the interlayer insulator 20, by the formation of the high water-resistant insulating film 22 on the organic resin layer 21, diffusion of moisture or oxygen of the oxidizing species into the organic resin layer can be effectively avoided.

That is, by using the SiO film of a high silicon content as at least one of the layers of the high water-resistant insulating film at 22, at an amount of bond between silicon and hydrogen in the film is increased, so that the moisture contained in SiO is reduced. Further, since the SiO film has the excellent water resisting property, diffusion of the moisture or oxygen in the oxidizing species into the organic resin layer at 21 at can be prevented.

When an SiON layer in which nitrogen is introduced in place of a part of oxygen having an affinity for water is used as at least one of the layers in the high water-resistant insulating film at 22, at the water resistance is more excellent. Consequently, the diffusion of the moisture or oxygen in the oxidizing species into the organic resin layer at 21 at can be more effectively prevented.

When an SiN film in which oxygen having an affinity for water is changed to nitrogen is used as at least one of the layers in the high water-resistant insulating film at 22, at the water resistance is further more excellent. Thus, the diffusion of the moisture or oxygen in the oxidizing species into the organic resin layer at 21 at can be more effectively prevented.

According to the invention, therefore, by the increase in the dielectric constant by the hydrolytic degradation in the resin composition of the organic resin layer at 21 at in the fabricating process or the decomposed resin interposed on the interface with the buried conductive layer 4, occurrence of a mechanical or electrical poor contact of the buried conductive layer 4 can be avoided.

With the structure, therefore, the increase in the parasitic capacity caused by the interlayer insulator and the resistance are reduced, delay time is shortened, and the power consumption is reduced, so that a very reliable semiconductor device can be formed.

An embodiment of a method of fabricating the semiconductor device according to the invention will now be described. Although an example of the method of fabricating the semiconductor device shown in FIG. 1 will be described with reference to of the processing drawings of FIGS. 3 and 4, the fabricating method of the invention is not limited to the example.

In the example, the device has the structure shown in FIG. 1 in which the organic resin layer 21 is made of poly-para-xylene and the SiO film having the Si content of 42 at % is used as the high water-resistant insulating film 22.

Figure 3A:
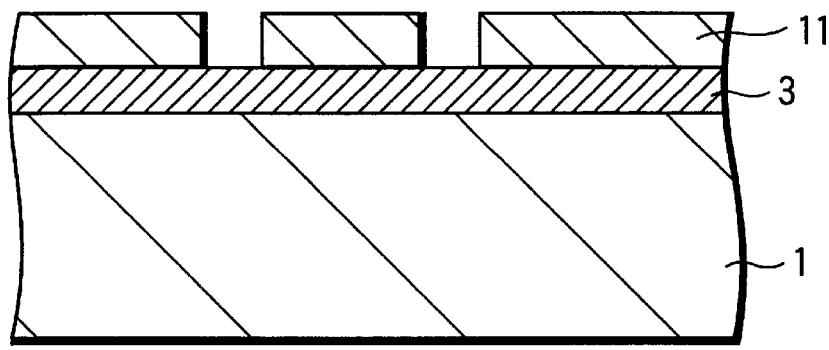
FIGS. 3A to 3C are process drawings (No. 1) of an example of a method of fabricating the semiconductor device according to the invention.

In this case, as shown in FIG. 3A, the substrate 1 such as a semiconductor substrate having various semiconductor areas (not shown) for forming circuit devices of a semiconductor integrated circuit or the like is prepared. The insulating film 3 made of $SiO_2$ formed by, for example, thermal oxidation is deposited on the rear face of the substrate 1.

On the insulating film 3, the lower conductive layer 11 is formed.

The lower conductive layer 11 is obtained in an ordinary manner such that an Al layer or the like is formed on the entire face and is subjected to pattern etching by using a photoresist layer in a predetermined pattern formed by photolithography, thereby obtaining a desired electrode or a wiring pattern.

Figure 3B:
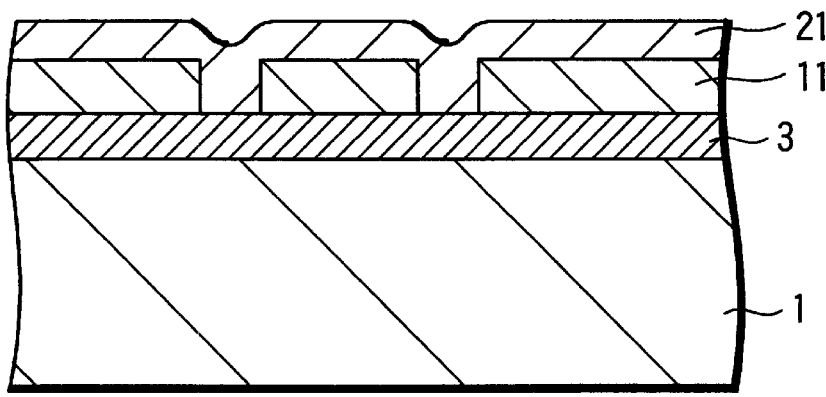

As shown in FIG. 3B, the organic resin layer 21 made of poly-para-xylene having a low dielectric constant is deposited by CVD on the entire face of the lower conductive layer 11.

Figure 5:
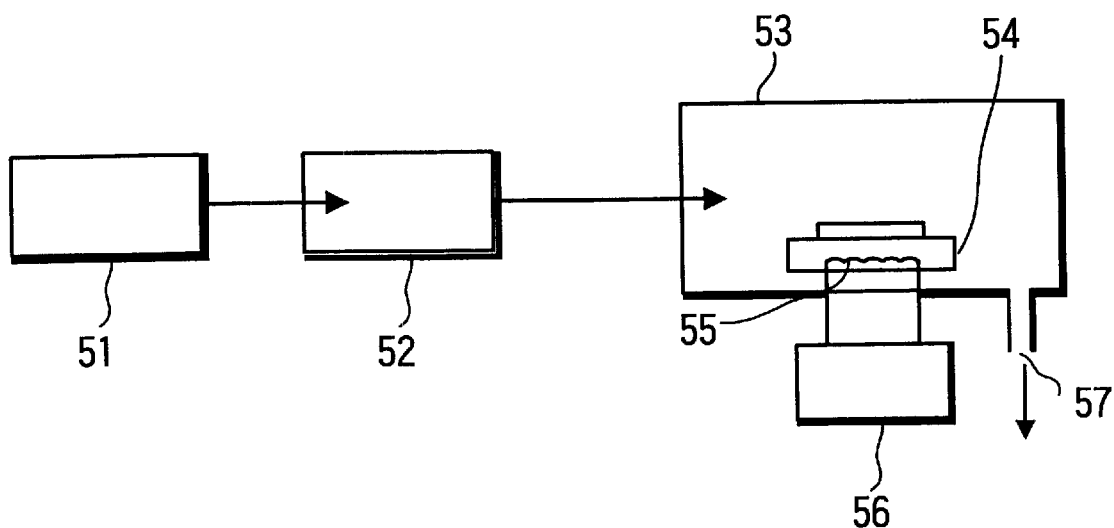
FIG. 5 is a schematic block diagram of an example of an apparatus for carrying out the semiconductor device fabricating method according to the invention.
Figure 6:
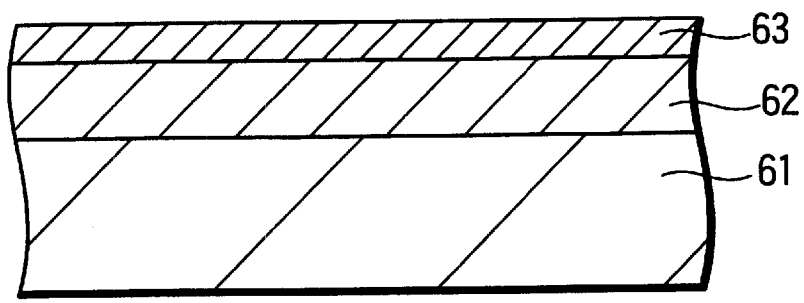
FIG. 6 is a schematic cross section of a water permeability test portion.

The organic resin layer 21 made of poly-para-xylene can be formed by a film forming apparatus of which schematic configuration is shown in FIG. 5. The apparatus comprises a vaporization chamber 51, a polymerization chamber 52, and a reaction chamber 53.

In the reaction chamber 53, a supporting stand 54 on which the substrate 1 is placed is disposed. The supporting stand 54 is provided with heating means 55. A heating controller 56 for controlling the passage of a current to control the heating means 55 to a predetermined temperature is provided. In the reaction chamber 53, an exhaust port 57 connected to exhaust means (not shown) is provided to set a predetermined pressure in the reaction chamber 53.

In this case, di-para-xylene is supplied to the vaporization chamber 51 and heated to, for example, 150° C. to perform vaporization and thermal decomposition, thereby obtaining a monomer. The monomer is sent to the polymerization chamber 52 controlled at 500° C. and is polymerized, thereby adjusting to a desired molecular weight. The resultant is supplied to the reaction chamber 53 to form the organic resin layer 21 made of poly-para-xylene on the substrate 1. Residual gas is exhausted from the exhaust port 57.

Figure 3C:
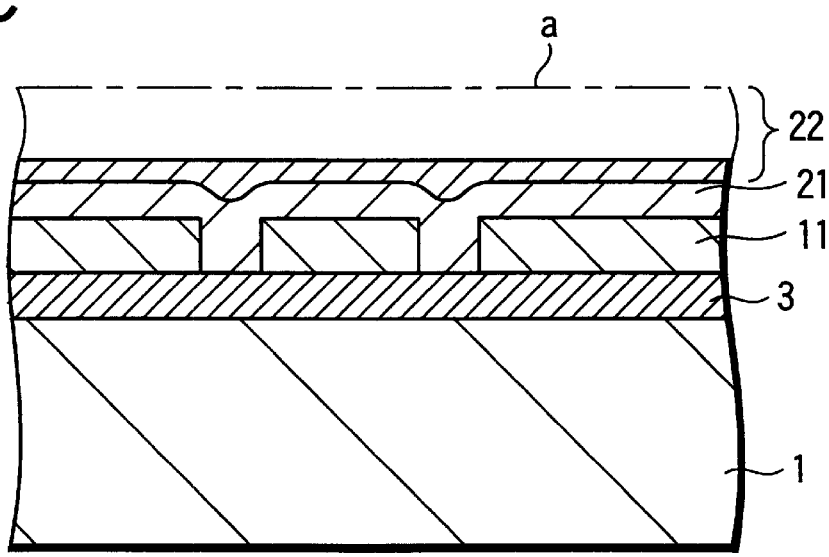

After that, on the entire face of the organic resin layer 21, SiO of an Si content of 42 at % is deposited thick enough to planarize the surface as shown by an alternate long and short dash line (a) in FIG. 3C by helicon plasma CVD. In this case, by supplying a raw material gas of monosilane $SiH_4$ and oxygen $O_2$ at a flow rate of 1:1, a film having a thickness of, for example, 2000 nm enough to planarize the surface is formed.

After that, the surface of the SiO layer is polished and planarized by chemical mechanical polishing (CMP), thereby forming the interlayer insulator 20 having a predetermined thickness such as 800 nm in which the organic resin layer 21 and the high water-resistant insulating film 22 are stacked.

Figure 4A:
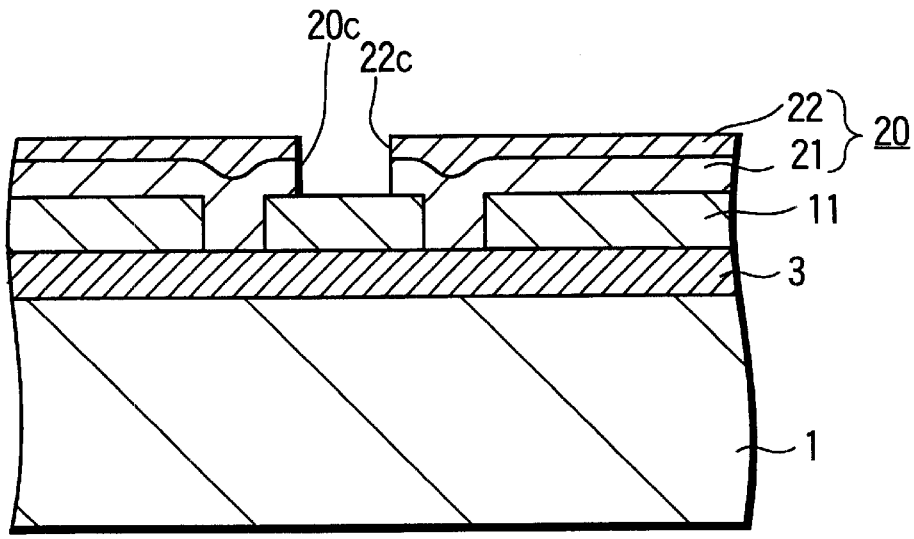
FIGS. 4A and 4B are process drawings (No. 2) of the example of the method of fabricating the semiconductor device according to the invention.

As shown in FIG. 4A, the connection hole 20c is opened in the interlayer insulator 20 formed as mentioned above over a predetermined part of the lower conductive layer 11. The connection hole 20c is formed in such a manner that a photoresist layer (not shown) is applied, an opening is formed in a predetermined part in the photoresist layer by photolithography, an opening 22c is opened in the high water-resistant insulating film 22 through the opening formed in the photoresist layer by using the photoresist layer as an etching mask, and the organic resin layer 21 is etched through the opening 22c by using the high water-resistant insulating film 22 as an etching mask.

Figure 4B:
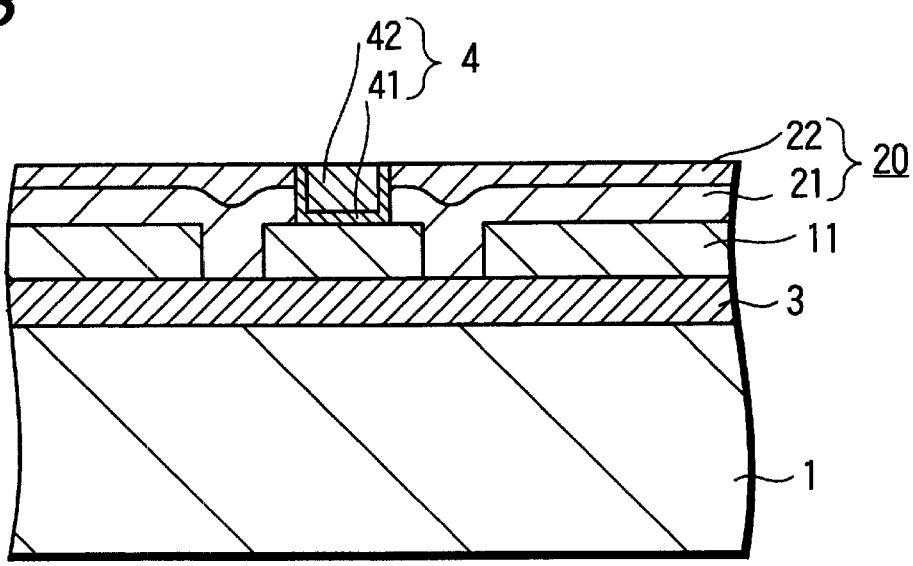

As shown in FIG. 4B, the buried conductive layer 4 in which the buried metal layer 42 is formed in the connection hole 20c via the metal underlayer 41 for obtaining adhesion is formed. The buried conductive layer 4 is formed in the connection hole 20c in such a manner that the metal underlayer 41 is formed by depositing titanium (nitride) by sputtering, after that, tungsten W is deposited by CVD and dry etching is performed.

As illustrated in FIG. 1, a conductive layer made of Al or the like is formed on the entire face of the buried conductive layer 4 by sputtering or the like and is etched in a predetermined pattern by using a photoresist layer patterned by photolithography as an etching mask, thereby forming the upper conductive layer 12 serving as the upper wiring layer or the like.

The lower conductive layer 11 and the upper conductive layer 12 are stacked via the interlayer insulator 20 and are electrically connected to each other in the predetermined part via the buried conductive layer 4.

The semiconductor device having the interlayer insulator 20 in which the high water-resistant insulating film 22 made of SiO having an Si content of 42 at % is formed on the organic resin layer 21 has high reliability and the improved yield because of the good contact between the first and second conductive layers.

The characteristic of the buried conductive layer 4 for connecting the first and second conductive layers 11 and 12 in the semiconductor device having the high water-resistant insulating film 22 made of SiO having an Si content of 42 at % was measured by a scanning electron microscope (SEM). The yield of the semiconductor device having sufficiently low contact resistance fabricated as a conforming item was 100%.

On the contrary, the yield of a similar semiconductor device with a structure of the interlayer insulator in which SiO having an Si content of 30 at % is stacked on the organic resin layer was 10%.

The yield is improved in the structure when the diffusion of moisture and oxygen into the organic resin layer is effectively avoided as mentioned above. When the high resistant insulating film 22 is made of, for example, SiO, especially when the Si content is 35 at % or higher, the effect was certainly produced. This is because of the improved water impermeability. The water impermeability of SiO was confirmed by measuring the concentration of phosphorus (P).

The measurement was carried out by using a sample obtained by forming a PSG (phosphorus doped $SiO_2$ film) 62 on an Si substrate 61 and depositing a silicon oxide film 63 having an Si content of 35 at % or higher on the PSG 62.

When a change with time in double bond (P=O) between P (phosphorus) and O (oxygen) with respect to the sample was evaluated by infrared spectroscopic analysis of measuring an increase/decrease of absorption by P=O at the wave number of 1180 $cm^{-1}$, the change with time hardly occurred. When the silicon oxide film 63 is water permeable, P=O and H2O react with each other in the PSG film 62, thereby producing P—OH and the concentration of P=O decreases. Consequently, by measuring the P=O concentration, the water permeability of the silicon oxide film 63 having an Si content of 35 at % or higher on the PSG film 62 is measured. In this case, since the change with time in P=O was hardly observed, it could be confirmed that the silicon oxide film 53 of the composition has excellent water permeability.

The above example relates to the case where the high water-resistant insulating film 22 is made of SiO having an Si content of 42 at %. Table 1 shows the flow rate between $SiH_4$ and $O_2$ when the content of Si is set to 35 at %, 42 at %, and 75 at %.

TABLE 1

| Si content | 35 at % | 42 at % | 75 at % |
|---|---|---|---|
| flow rate between silane and $O_2$ | 1.0:1.2 | 1.0:1.0 | 1.0:0.1 |

In the above example, the high water-resistant insulating film 22 made of SiO is fabricated by using a raw material of monosilane $SiH_4$ and $O_2$. The raw material of Si is not limited to monosilane but disilane, trisilane or the like can be used. In the case of forming SiON, $N_2O$ or $O_2$ and $NH_3$ can be used.

Another embodiment of the fabricating method of the invention will now be described. The method of fabricating the semiconductor device shown in FIG. 2 will be described with reference to the process diagrams of FIGS. 7 and 8. The fabricating method of the invention is not limited to the example.

Figure 7A:
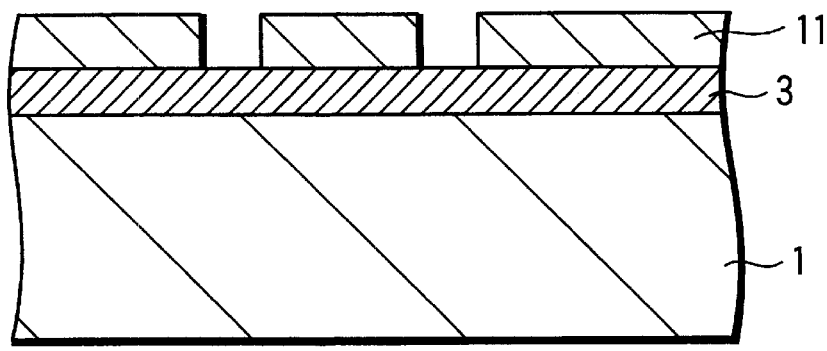
FIGS. 7A to 7C are process drawings (No. 1) of another method of fabricating the semiconductor device according to the invention.

In this case, as shown in FIG. 7A, in a manner similar to that of FIG. 3A, the lower conductive layer 11 is formed on the $SiO_2$ insulating layer 3 deposited on the surface of the substrate 1 such as the semiconductor substrate 1 in which various semiconductor areas (not shown) for circuit devices of a semiconductor integrated circuit are formed.

Figure 7B:
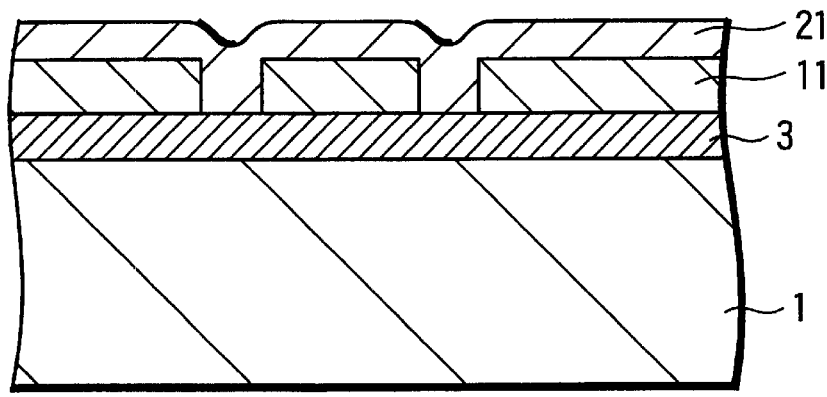

As shown in FIG. 7B, the organic resin layer 21 of a low dielectric constant made of polyimide fluoride is formed by the rotational application method on the entire face of the lower conductive layer 11.

Figure 7C:
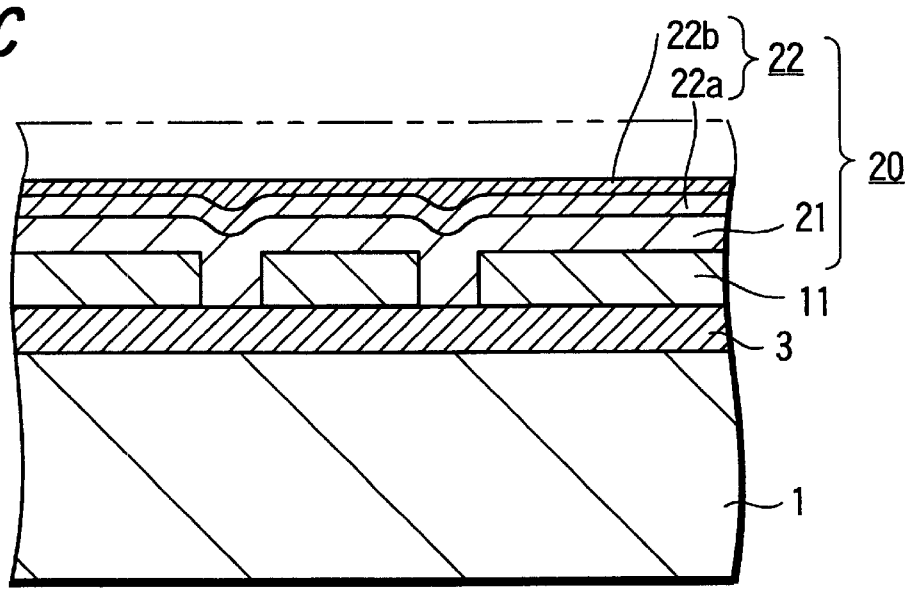

As shown in FIG. 7C, the first high water-resistant insulating film 22a made of SiN is deposited on the entire face by, for example, CVD using a raw material gas of silane and N2O to a thickness of 100 nm or the like.

Further, as shown by an alternate long and two short dashes line a in FIG. 7C, the second high water-resistant insulating film 22b made of SiO having an Si content of 42 at % or the like is deposited on the entire face by ordinary CVD to, for example, 2000 nm which is thick enough to planarize the surface. After that, the surface of the second high water-resistant insulating film 22b is polished by chemical mechanical polishing (CMP) to be flat and to a predetermined thickness such as the total thickness of the first and second high water-resistant insulating films 22a and 22b of 200 nm in a planarized portion. In such a manner, the high water-resistant insulating film 22 having the two-layer structure of the first and second high water-resistant insulating films 22a and 22b is formed, and the interlayer insulator 20 is formed by the organic insulating layer 21 and the high water-resistant insulating film 22.

Figure 8A:
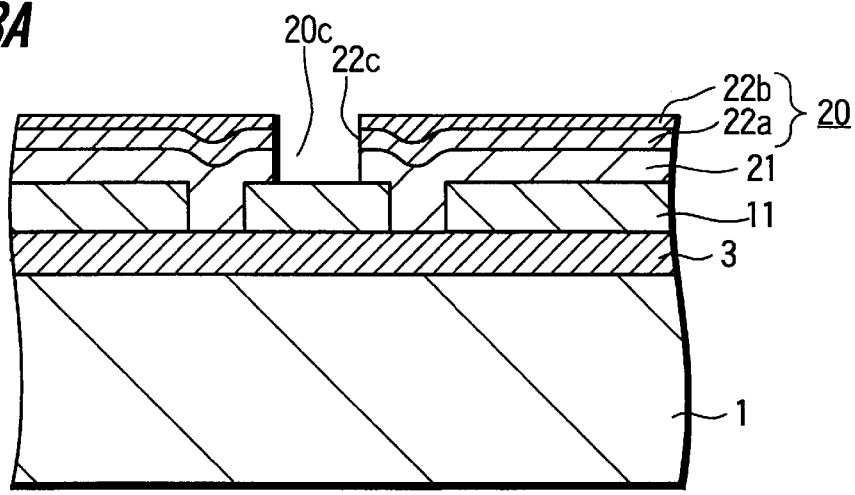
FIGS. 8A and 8B are process drawings (No. 2) of the another method of fabricating the semiconductor device according to the invention.

As shown in FIG. 8A, the connection hole 20c is opened in the interlayer insulator 20 formed as mentioned above over a predetermined part of the lower conductive layer 11. The connection hole 20c is formed by applying the photoresist layer (not shown), the opening is formed in a predetermined part of the photoresist layer by photolithography, the opening 22c is formed in the high water-resistant insulating film 22 by using the photoresist layer as an etching mask, and the organic resin layer 21 is etched through the opening 22c by using the high water-resistant insulating film 22 as an etching mask.

Figure 8B:
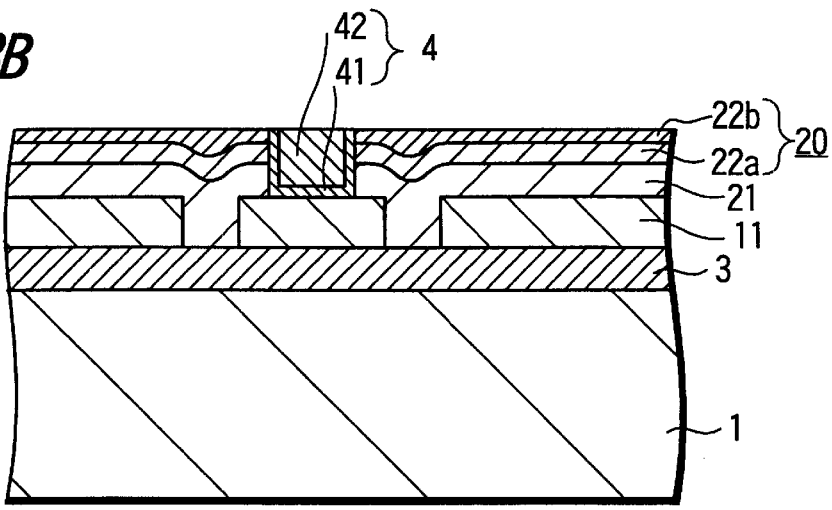
Figure 9:
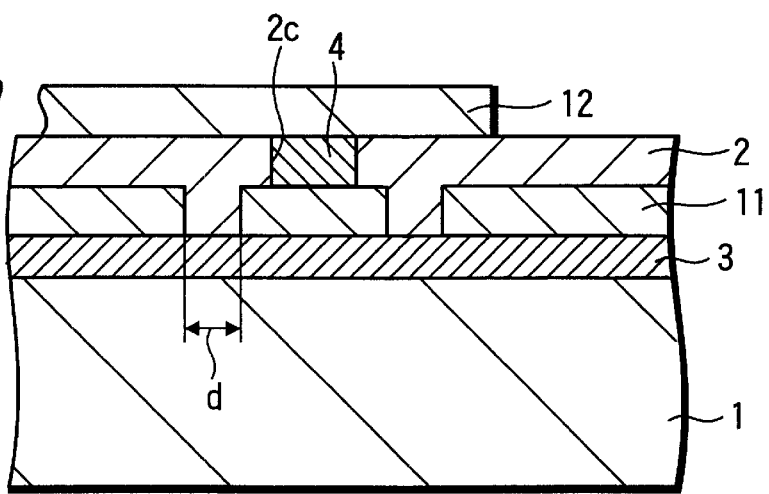
FIG. 9 is an enlarged schematic cross section of the main part of a conventional semiconductor device.
Figure 10A:
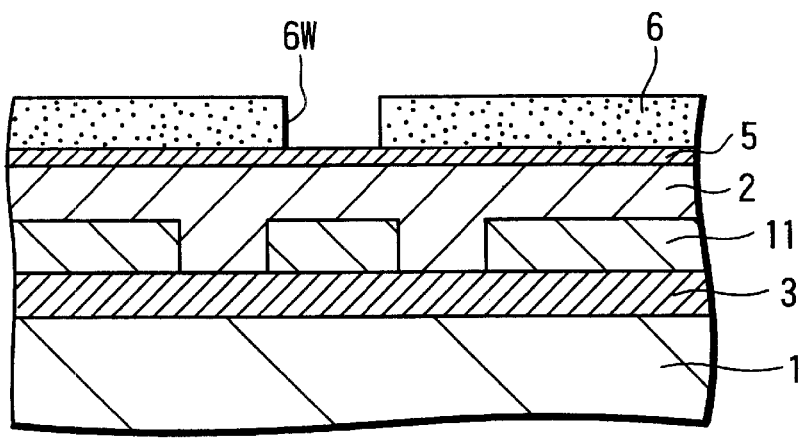
FIGS. 10A to 10C are process drawings of an example of a conventional method of fabricating a semiconductor device.
Figure 10B:
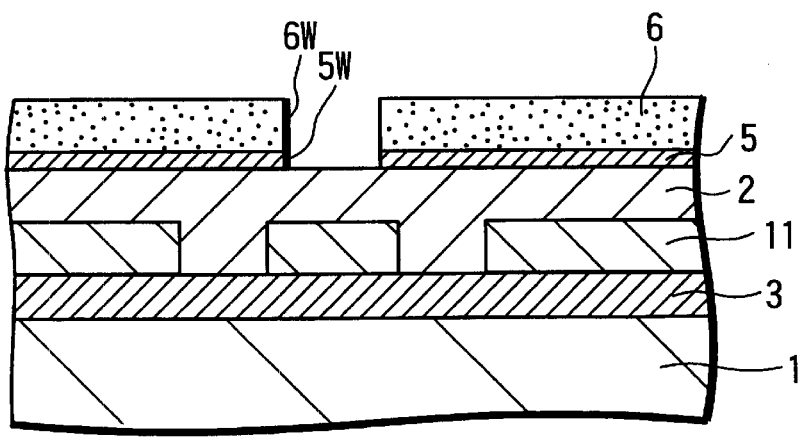
Figure 10C:
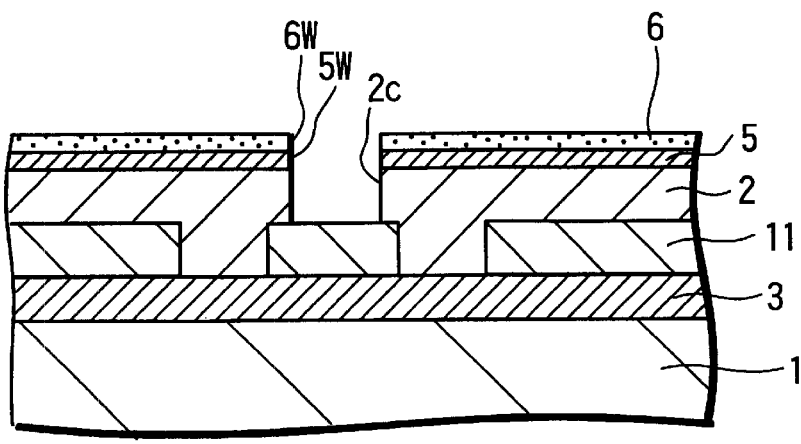

As shown in FIG. 8B, in a manner similar to FIG. 4B, the buried conductive layer 4 obtained by forming the buried metal layer 42 via the metal underlayer 41 is formed in the connection hole 20c.

After that, as illustrated in FIG. 2, the conductive layer made of Al is deposited on the entire surface of the buried conductive layer 4 by sputtering or the like and is etched in a predetermined pattern by using a photoresist layer patterned by photolithography as an etching mask, thereby forming the upper conductive layer 12 serving as an upper wiring layer or the like.

In such a manner, the lower conductive layer 11 and the upper conductive layer 12 are stacked via the interlayer insulator 20 and are electrically connected to each other in a predetermined part via the buried conductive layer 4.

The above examples relates to the case where the organic resin layer 21 having a low dielectric constant is made of poly-para-xylene or polyimide fluoride. Besides, for example, polyimide, polyquinoline, polyamide, or the like can be also used.

In the semiconductor device according to the invention, the interlayer insulator 20 has the structure such that the high water-resistant insulating film 22 is stacked on the organic resin layer 21, thereby enabling the diffusion of the moisture or oxygen in the oxidizing species into the organic resin layer 21 can be prevented. For example, an inconvenience such that the dielectric constant increases by the hydrolytic degradation in the resin composition of the organic resin layer 21 during the fabricating process of the semiconductor device or the decomposed matters of the resin are interposed on the interface with the buried conductive layer 4, thereby causing a mechanical or electrical poor contact of the buried conductive layer 4 can be avoided.

With the structure, therefore, the increase in the parasitic capacity caused by the interlayer insulator and the resistance are reduced, delay time is shortened, and the power consumption can be reduced, so that a very reliable semiconductor device can be formed.

According to the semiconductor device fabricating method of the invention, the semiconductor device of a high yield as the object can be easily fabricated only by adding the process of forming the high water-resistant insulating film.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor device comprising a lower conductive layer and an upper conductive layer which are formed via an interlayer insulator on a substrate, wherein the interlayer insulator has a stack structure of an organic resin layer formed on and in contact with the lower conductive layer and a first high water-resistant insulating film and a second high water-resistant insulating film formed on the organic resin layer, the first high water-resistant insulating film being in contact with the organic resin layer, wherein the first high water-resistant insulating film formed in contact with the organic resin layer is a silicon oxynitride film having a silicon content of 35 at % to 55 at %, wherein the organic resin layer comprises a material selected from the group consisting of polyaryl ether, polyimide fluoride, poly-para-xylene, polyimide, polyquinoline, and polyamide, and wherein the second high water-resistant insulating film is one of a silicon oxide film and a silicon nitride film.

2. A semiconductor device comprising a lower conductive layer and an upper conductive layer which are formed via an interlayer insulator on a substrate, wherein the interlayer insulator has a stack structure of an organic resin layer formed on and in contact with the lower conductive layer and a first high water-resistant insulating film and a second high water-resistant insulating film formed on the organic resin layer, the first high water-resistant insulating film being in contact with the organic resin layer, wherein the first high water-resistant insulating film formed in contact with the organic resin layer is an SiO film having a silicon content of 40 at % to 60 at %, and wherein organic resin layer comprises a material selected from the group consisting of polyaryl ether, polyimide fluoride, poly-para-xylene, polyimide, polyquinoline, and polyamide.

3. The semiconductor device according to claim 1, wherein the second high water-resistant insulating film is one of a silicon oxynitride film and a silicon nitride film.

* * * * *